(12) United States Patent
Ballan

(10) Patent No.: US 6,859,100 B2
(45) Date of Patent: Feb. 22, 2005

(54) CLASS-A AMPLIFIER CIRCUIT HAVING OUTPUT VOLTAGE VARIED ACCORDING TO INPUT VOLTAGE

(75) Inventor: Hussein Ballan, Blonay (CH)

(73) Assignee: Advanced Silicon S.A., Lausanne (CH)

( * ) Notice: Subject to any disclaimer, the term of this patent is extended or adjusted under 35 U.S.C. 154(b) by 8 days.

(21) Appl. No.: 10/648,337

(22) Filed: Aug. 27, 2003

(65) Prior Publication Data

US 2004/0041631 A1 Mar. 4, 2004

(30) Foreign Application Priority Data

Aug. 28, 2002 (TW) .......................... 91119595 A

(51) Int. Cl.$^7$ .............................................. H03F 3/26
(52) U.S. Cl. ................................. 330/255; 330/264
(58) Field of Search ............................... 330/253, 255, 330/257, 262, 264

(56) References Cited

U.S. PATENT DOCUMENTS

| 6,066,985 A | * | 5/2000 | Xu | 330/255 |
| 6,285,256 B1 | * | 9/2001 | Wong | 330/255 |
| 6,437,645 B1 | * | 8/2002 | Ivanov et al. | 330/255 |

* cited by examiner

Primary Examiner—Khanh V. Nguyen
(74) Attorney, Agent, or Firm—Bacon & Thomas PLLC

(57) ABSTRACT

A class-A amplifier circuit having output voltage varied according to input voltage includes a class-A amplifier, a voltage pull-up switch level circuit, an output voltage of the class-A amplifier, a voltage pull-up switch circuit, a voltage pull-down switch level circuit, a voltage pull-down circuit, a voltage pull-down switch circuit, and a bias circuit. The circuit utilizes the voltage pull-up and the voltage pull-down circuits to enable an output voltage of the class-A amplifier to rapidly and precisely change as an input voltage changes. Moreover, the circuit utilizes the voltage pull-up and the voltage pull-down switch circuits to prevent an overshooting from occurring.

8 Claims, 4 Drawing Sheets

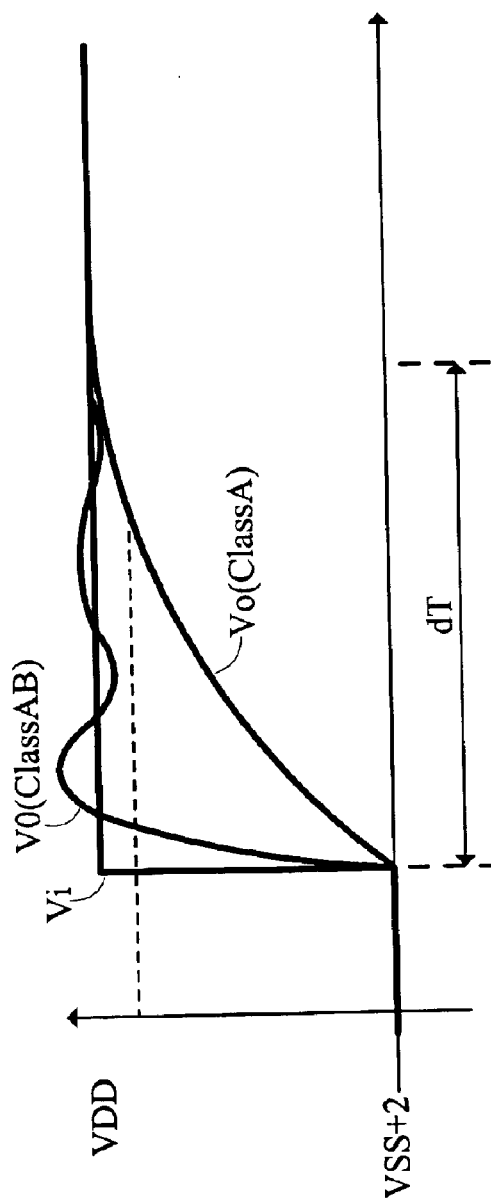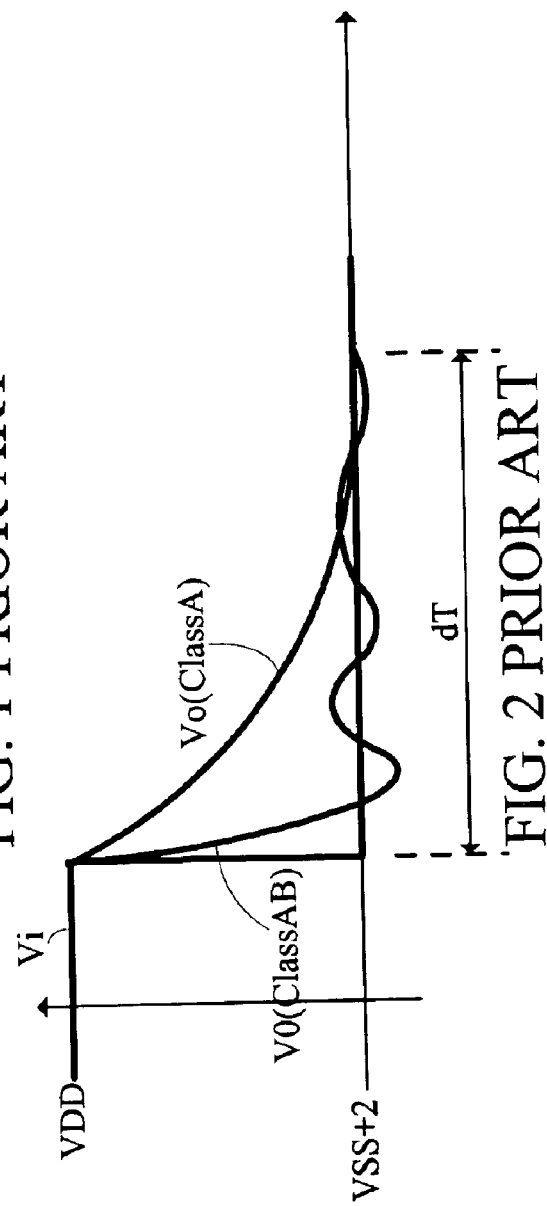

CLASS-A AMPLIFIER CIRCUIT HAVING OUTPUT VOLTAGE VARIED ACCORDING TO INPUT VOLTAGE

BACKGROUND OF THE INVENTION

1. Field of the Invention

The present invention relates to a class-A amplifier and, more particularly, to a class-A amplifier circuit having output voltage capable of being rapidly and precisely varied as an input voltage changes.

2. Description of Related Art

Output voltages of conventional CMOS (complementary metal oxide semiconductor) class-A and class-AB amplifiers are shown in FIGS. 1 and 2. In FIG. 1, input voltage is boosted from a low level (e.g., VSS+2V≈2V) to a high level (e.g., VDD≈10V). On the contrary, in FIG. 1, input voltage is lowered from a high level (e.g., VDD≈10V) to a low level (e.g., VSS+2V≈2V). It is seen that there is no overshooting in the output voltage of the class-A amplifier in either figure. However, a relatively long period of time is required for either rising the output voltage of the class-A amplifier from the low level to the high level or lowering the same from the high level to the low level. This can limit an operating frequency of the class-A amplifier. Advantageously, only a relatively short period of time is required for either rising the output voltage of the class-AB amplifier from the low level to the high level or lowering the same from the high level to the low level. Unfortunately, the output voltage of the class-AB amplifier tends to overshoot, resulting in a generation of noise in the device.

Therefore, it is desirable to provide a novel amplifier circuit in order to mitigate and/or obviate the aforementioned problems.

SUMMARY OF THE INVENTION

An object of the present invention is to provide a class-A amplifier circuit having voltage pull-up and voltage pull-down capabilities so that its output voltage is capable of being rapid and precisely changed as an input voltage changes.

Another object of the present invention is to provide a class-A amplifier circuit having voltage pull-up and voltage pull-down switch capabilities so as to increase a voltage pull-up or pull-down in order to prevent an overshooting from occurring.

To achieve the objects, there is provided a class-A amplifier circuit having output voltage varied according to input voltage, which includes: a class-A amplifier; a voltage pull-up switch level circuit for generating a pull-up switch level; a voltage pull-up circuit for pulling up an output voltage of the class-A amplifier; a voltage pull-up switch circuit for comparing the output voltage of the class-A amplifier with the pull-up switch level, and for driving the voltage pull-up circuit to pull up the output voltage of the class-A amplifier when the output voltage of the class-A amplifier is lower than the pull-up switch level; a voltage pull-down switch level circuit for generating a pull-down switch level; a voltage pull-down circuit for pulling down the output voltage of the class-A amplifier; and a voltage pull-down switch circuit for comparing the output voltage of the class-A amplifier with the pull-down switch level and for driving the voltage pull-down circuit to pull down the output voltage of the class-A amplifier when the output voltage of the class-A amplifier is higher than the pull-up switch level.

Other objects, advantages, and novel features of the invention will become more apparent from the detailed description when taken in conjunction with the accompanying drawings.

BRIEF DESCRIPTION OF THE DRAWINGS

FIGS. 1 and 2 show the output waveforms of conventional class-A and class-AB amplifiers;

DETAILED DESCRIPTION OF THE PREFERRED EMBODIMENT

Figure 3:
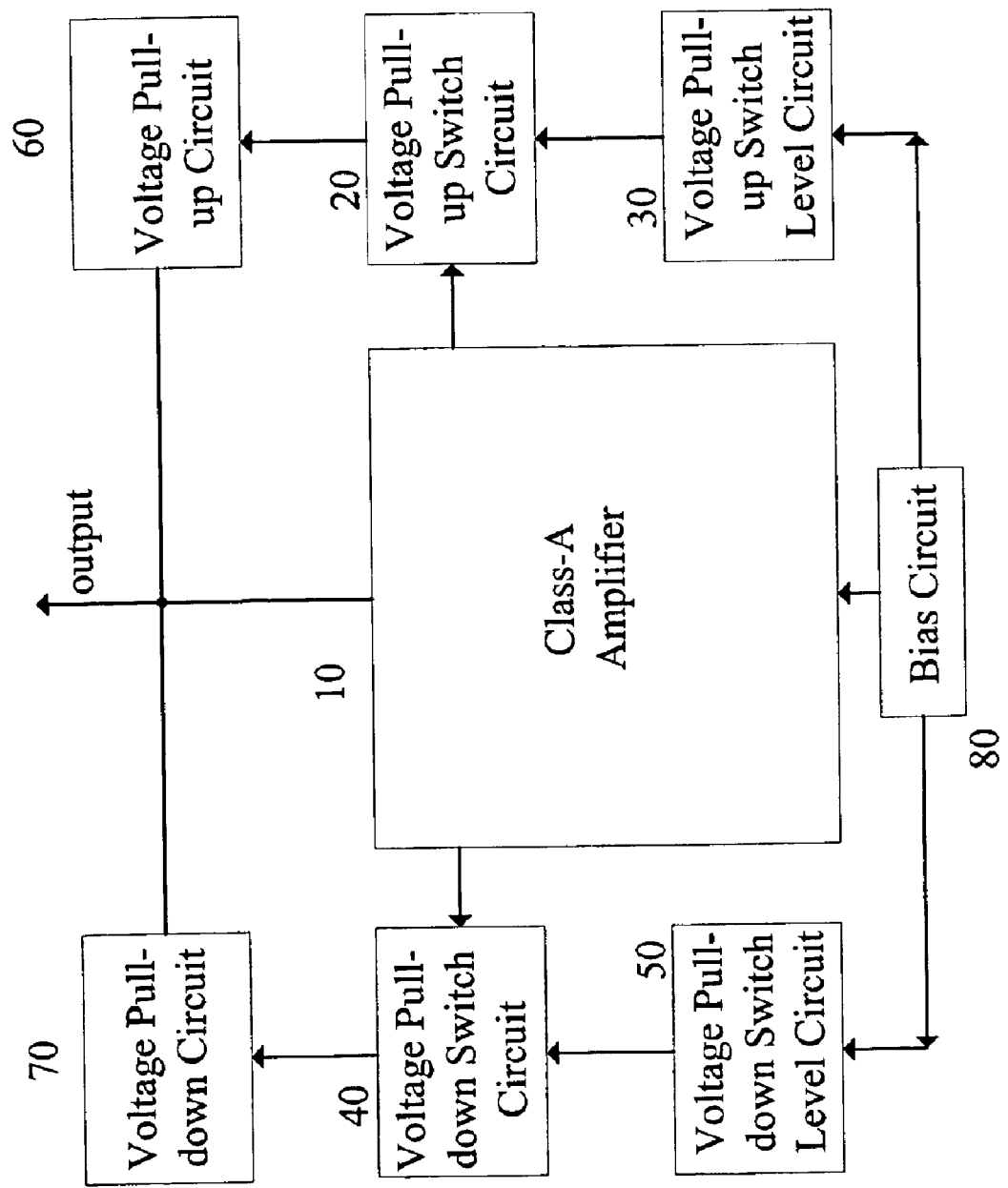
FIG. 3 is a block diagram of the class-A amplifier circuit having output voltage varied according to input voltage in accordance with the present invention.

With reference to FIG. 3, there is shown a class-A amplifier circuit having output voltage varied according to input voltage in accordance with the present invention. the circuit includes a class-A amplifier 10, a voltage pull-up switch circuit 20, a voltage pull-up switch level circuit 30, a voltage pull-down switch circuit 40, a voltage pull-down switch level circuit 50, a voltage pull-up circuit 60, a voltage pull-down circuit 70, and a bias circuit 80. The class-A amplifier 10 can be implemented as a typical amplifier for signal amplification. The bias circuit 80 serves to provide a direct current (DC) bias required for a normal operation of the device.

The voltage pull-up switch level circuit 30 is provided to generate a pull-up switch level. The voltage pull-up switch circuit 20 is provided to compare the output voltage of the class-A amplifier 10 with the pull-up switch level. In case that the output voltage of the class-A amplifier 10 is lower than the pull-up switch level, the voltage pull-up circuit 60 is driven to pull up the output voltage of the class-A amplifier 10. Otherwise, the voltage pull-up circuit 60 is disabled. The voltage pull-down switch level circuit 50 is provided to generate a pull-down switch level. Similarly, the voltage pull-down switch circuit 40 is provided to compare the output voltage of the class-A amplifier 10 with the pull-down switch level. In case that the output voltage of the class-A amplifier 10 is higher than the pull-down switch level, the voltage pull-down circuit 70 is driven to pull down the output voltage of the class-A amplifier 10. Otherwise, the voltage pull-down circuit 70 is disabled.

Figure 4:
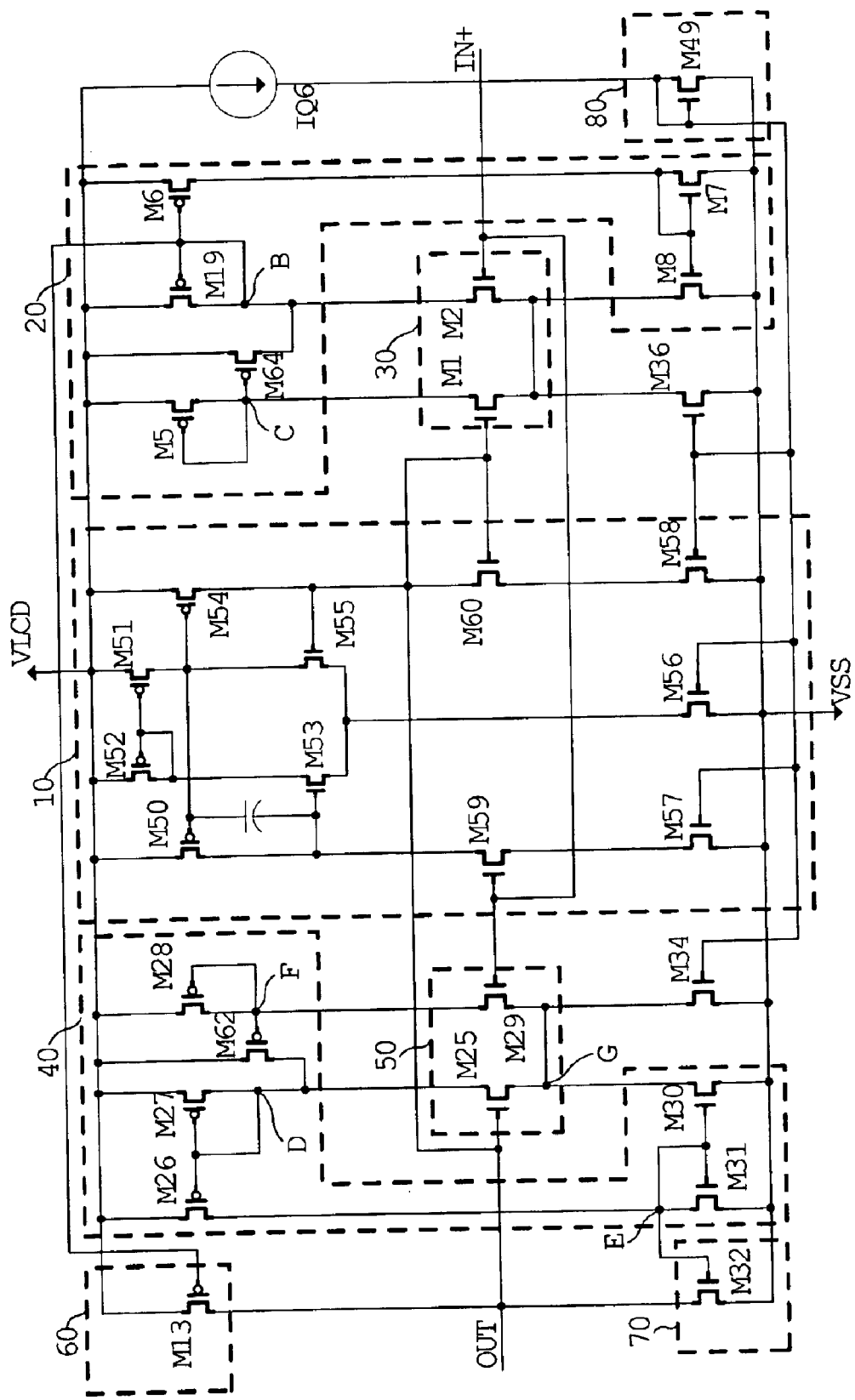
FIG. 4 is a circuit diagram of the class-A amplifier circuit having output voltage varied according to input voltage in accordance with the present invention.

With reference to FIG. 4, a detail circuit diagram of FIG. 3 is shown. The class-A amplifier 10 is formed of MOS (metal oxide semiconductor) transistors. The voltage pull-up switch circuit 20 comprises PMOS (positive channel MOS) transistors M5, M64, M19, and M6 and NMOS (negative channel MOS) transistors M7 and M8. Sources of the transistors M5, M64, M19, and M6 are coupled to VLCD. Gate and drain of the transistor M5 and gate of the transistor M64 are coupled to node C. Drain of the transistor M64, gate and drain of the transistor M19, and gate of the transistor M6 are coupled to node B. The node B is coupled to gates of the transistors M13 and M6 respectively for controlling the transistors M13 and M6 to be on or off. Also, drains of the NMOS transistors M7 and M8 are coupled to VSS. Drain of the transistor M6 is coupled to gate and drain of the transistor M7 and gate of the transistor M8 respectively for controlling the transistor M8 to be on or off.

The voltage pull-up switch level circuit 30 is provided to generate a voltage level X for use as a pull-up switch level when the output voltage of the class-A amplifier 10 is pulled up. The voltage pull-up switch level circuit 30 consists of NMOS transistors M1 and M2. The transistor M1 has a drain coupled to node C, a source coupled to drains of the transistors M36 and M8, and a gate coupled to output node OUT. The transistor M2 has a drain coupled to node B, a source coupled to drains of the transistors M36 and M8, and a gate coupled to input node IN+.

The voltage pull-down switch circuit 40 consists of PMOS transistors M26, M27, M62, and M28 and NMOS transistors M31 and M30. The sources of the transistors M26, M27, M62, and M28 are coupled to VLCD. The gate and drain of the transistor M28 and the gate of the transistor M62 are coupled to node F. The drain of the transistor M62, the gate and drain of the transistor M27, and the gate of the transistor M26 are coupled to node D. The drain of the transistor M26 is coupled to gate and drain of the transistor M31 for controlling the transistors M30 and M32 to be on or off.

The voltage pull-down switch level circuit 50 is provided to generate a voltage level Y for use as a pull-down switch level when the output voltage of the class-A amplifier is pulled down. The voltage pull-down switch level circuit 50 consists of NMOS transistors M25 and M29. The transistor M25 has a drain coupled to node D, a source coupled to drains of the transistors M30 and M34, and a gate coupled to the output node OUT. The transistor M29 has a drain coupled to node F, a source coupled to drains of the transistors M30 and M34, and a gate coupled to the input node IN+.

The voltage pull-up circuit 60 consists of a PMOS transistor M13 having a drain coupled to the output node OUT and a source coupled to VLCD. The transistor M13 will be turned on when voltage at the node B is lowered to be smaller then VLCD minus the threshold voltage of a PMOS transistor due to the voltage pull-up switch level circuit 30 being activated. As a result, voltage of the output node increases rapidly.

The voltage pull-down circuit 70 consists of a NMOS transistor M32 having a drain coupled to the output node OUT and a source coupled to VSS. The transistors M26 and M31 will be turned on when voltage at the node D is lowered to be smaller than VLCD minus the threshold voltage of a PMOS transistor due to the voltage pull-down switch circuit 40 being activated. Hence, the transistor M32 will also be turned on, resulting in a rapid drop of the voltage of the output node.

The bias circuit 80 consists of a NMOS transistor M49 having gate and drain both coupled to a current source IQ6 to form a bias circuit. Hence, the NMOS transistors M36, M58, M56, M57, and M34 are always on so as to generate a required bias current.

Figure 5:
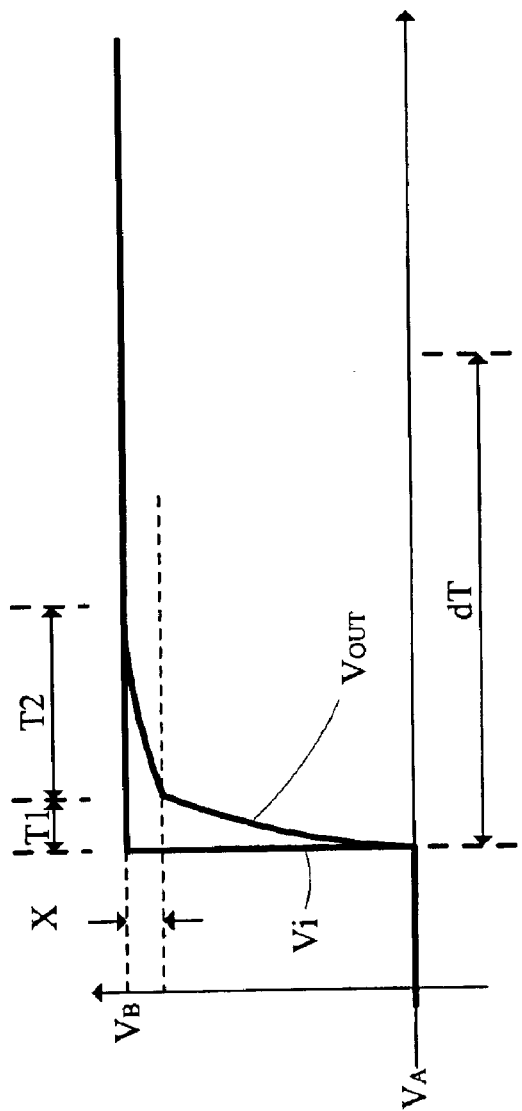
FIGS. 5 and 6 show the working waveform of the class-A amplifier circuit having output voltage varied according to input voltage in accordance with the present invention.
Figure 6:
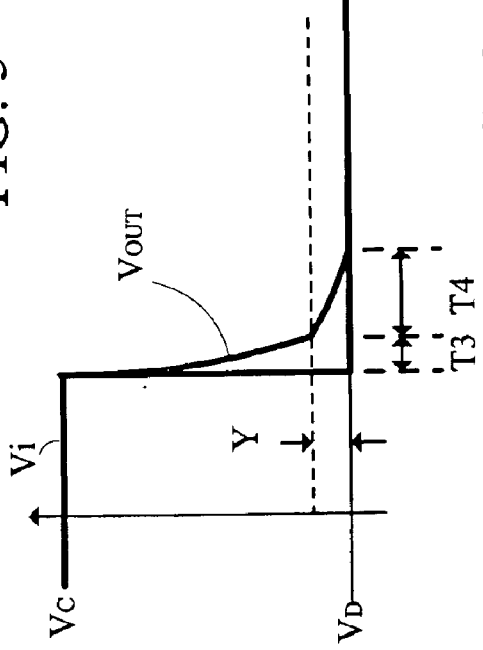

FIGS. 5 and 6 plot input voltages versus time for output voltage curves of the class-A amplifier 10 utilized in the invention where the input voltage is risen in FIG. 5 while the input voltage is lowered in FIG. 6. In detail, range of a nominal input voltage of the class-A amplifier 10 is about from VSS+1.2V to VLCD. Within the range (see FIG. 5), the input voltage of the class-A amplifier 10 is risen from a low level $V_A$ to a high level $V_B$. In case that output voltage is lower than $(V_B-X)$ (at a time period T1), the input voltage of the class-A amplifier 10 will rapidly change from a low level to a high level due to a pulling up of the voltage pull-up circuit 60. In another case that the output voltage is larger than $(V_B-X)$ (at a time period T2) the voltage pull-up circuit 60 will be disabled to prevent an overshooting from occurring. Moreover, when the input voltage of the class-A amplifier 10 is lowered from a high level $V_C$ to a low level $V_D$, if output voltage is higher than $(V_D+Y)$ (at a time period T3), the input voltage of the class-A amplifier 10 will rapidly change from a high level to a low level due to a pulling down of the voltage pull-down circuit 70. If the output voltage is lower than $(V_D+Y)$ (at a time period T4), the voltage pull-down circuit 70 will be disabled to prevent an overshooting from occurring.

In the time period T1, the input voltage of the class-A amplifier 10 is changed from the low level to the high level and the output voltage $V_{OUT}$ is less than $(V_B-X)$. Hence, the transistors M1, M5, and M64 are turned off, while the transistors M2 and M19 are turned on. Consequently, voltage at the node B is pulled down for turning on the transistor M13. This in turn can rapidly increase the output voltage of the class-A amplifier 10 from the low level to the high level. At the same time, the transistors M6 and M7 of the voltage pull-up switch circuit 20 are turned on, thereby making the transistor M8 be turned on temporarily to provide an additional bias current to both the voltage pull-up switch level circuit 30 and the voltage pull-up switch circuit 20 for rapidly increasing a switching rate of these two circuits as well as increasing a voltage pull-up rate of the voltage pull-up circuit 60.

In the time period T2, the output voltage $V_{OUT}$ is larger than $(V_B-X)$. Hence, the transistors M1, M5, and M64 are changed from off state to on state, while the transistors M2, M6, M7, and M19 are changed into off state. Voltage at the node B is pulled up to VLCD for turning off the transistor M13, resulting in a stop of the rapid pull-up of the output voltage $V_{OUT}$. At the same time, the transistor M8 is turned off for lowering the bias currents of both the voltage pull-up switch level circuit 30 and the voltage pull-up switch circuit 20.

In the time period T3, the input voltage of the class-A amplifier 10 is changed from high level to low level, and the output voltage $V_{OUT}$ is larger than $(V_D+Y)$. Hence, the transistors M29, M28, and M62 are turned off, while the transistors M25 and M27 are turned on. Consequently, voltage at the node D is pulled down for turning on the transistors M26, M31, and M32. This in turn can rapidly increase the output voltage of the class-A amplifier 10 from the high level to the low level. At the same time, the transistor M30 of the voltage pull-down switch circuit 40 is turned on to provide an additional bias current to both the voltage pull-down switch level circuit 50 and the voltage pull-down switch circuit 40 for rapidly increasing a switching rate of these two circuits as well as increasing a voltage pull-down rate of the voltage pull-down circuit 70.

In the time period T4, the output voltage $V_{OUT}$ is smaller than $(V_D+Y)$. Hence, the transistors M29, M28, and M62 are changed from off state to on state while the transistors M25 and M27 are changed into off state. Voltage at the node D is pulled up to VLCD for turning off the transistor M26, M31, and M32, resulting in a stop of the rapid pull-down of the output voltage $V_{OUT}$. At the same time, the transistor M30 is turned off for lowering the bias currents of both the voltage pull-down switch level circuit 50 and the voltage pull-down switch circuit 40.

In the above circuit, the transistor M1 is changed from off state to on state because an differential input current $i_{M1}$ is equal to $i_{M2}$, where $i_{M1}$ is $i_{DS}$ current of the transistor M1 and $i_{M2}$ is $i_{DS}$ current of the transistor M2. Also, both $i_{M1}$ and $i_{M2}$ can be defined by the following equations:

$$i_{M1} = \frac{\mu_n C_{ox}}{2} \frac{W}{L}(v_{GS} - V_T)^2 = \frac{\mu_n C_{ox}}{2} \frac{W_1}{L_1}(V_1 - V_T)^2 =$$

$$i_{M2} = \frac{\mu_n C_{ox}}{2} \frac{W}{L}(v_{GS} - V_T)^2 = \frac{\mu_n C_{ox}}{2} \frac{W_2}{L_2}(VDD - V_T)^2.$$

Both the transistors M1 and M2 have the same $\mu_n C_{ox}$ due to the same manufacturing process of the transistors. Thus, it is possible of setting the pull-up switch level X by adjusting channel width $W_1$ and length $L_1$ of the transistor M1 and channel width $W_2$ and length $L_2$ of the transistor M2. Similarly, it is possible of setting the pull-down switch level Y by adjusting channel width $W_{25}$ and length $L_{25}$ of the transistor M25 and channel width $W_{29}$ and length $L_{29}$ of the transistor M29.

In view of the forgoing, it is known that the invention utilizes the voltage pull-up circuit 60 and the voltage pull-down circuit 70 to enable the output voltage of class-A amplifier 10, so that the output voltage can rapidly and precisely vary as the input voltage changes. Moreover, the invention utilizes the voltage pull-up switch circuit 20 and the voltage pull-down switch circuit 40 to prevent an overshooting from occurring.

Although the present invention has been explained in relation to its preferred embodiment, it is to be understood that many other possible modifications and variations can be made without departing from the spirit and scope of the invention as hereinafter claimed.

What is claimed is:

1. A class-A amplifier circuit having output voltage varied according to input voltage comprising:

a class-A amplifier;

a voltage pull-up switch level circuit for generating a pull-up switch level;

a voltage pull-up circuit for pulling up an output voltage of the class-A amplifier;

a voltage pull-up switch circuit for comparing the output voltage of the class-A amplifier with the pull-up switch level, and for driving the voltage pull-up circuit to pull up the output voltage of the class-A amplifier when the output voltage of the class-A amplifier is lower than the pull-up switch level;

a voltage pull-down switch level circuit for generating a pull-down switch level;

a voltage pull-down circuit for pulling down the output voltage of the class-A amplifier; and a voltage pull-down switch circuit for comparing the output voltage of the class-A amplifier with the pull-down switch level and for driving the voltage pull-down circuit to pull down the output voltage of the class-A amplifier when the output voltage of the class-A amplifier is higher than the pull-up switch level.

2. The class-A amplifier circuit as claimed in claim 1, wherein the voltage pull-up switch level circuit consists of two NMOS transistors for providing the pull-up switch level.

3. The class-A amplifier circuit as claimed in claim 1, wherein the voltage pull-down switch level circuit consists of two NMOS transistors for providing the pull-down switch level.

4. The class-A amplifier circuit as claimed in claim 1, wherein the voltage pull-up circuit is disabled by the voltage pull-up switch circuit when the output voltage of the class-A amplifier is higher than the pull-up switch level.

5. The class-A amplifier circuit as claimed in claim 1, wherein the voltage pull-down circuit is disabled by the voltage pull-down switch circuit when the output voltage of the class-A amplifier is lower than the pull-up switch level.

6. The class-A amplifier circuit as claimed in claim 1, wherein the voltage pull-up circuit consists of a PMOS transistor, and the PMOS transistor is turned on when the voltage pull-up circuit is driven, so as to pull up the output voltage of the class-A amplifier.

7. The class-A amplifier circuit as claimed in claim 1, wherein the voltage pull-down circuit consists of a NMOS transistor, and the NMOS transistor is turned on when the voltage pull-down circuit is driven, so as to pull down the output voltage of the class-A amplifier.

8. The class-A amplifier circuit as claimed in claim 1, further comprising a bias circuit for providing a DC bias for the circuit.

* * * * *